United States Patent
Jia et al.

(10) Patent No.: US 12,433,125 B2
(45) Date of Patent: Sep. 30, 2025

(54) DISPLAY SUBSTRATE AND DISPLAY DEVICE

(71) Applicants: Hefei BOE Joint Technology Co., Ltd., Anhui (CN); BOE Technology Group Co., Ltd., Beijing (CN)

(72) Inventors: Wenbin Jia, Beijing (CN); Wenfeng Song, Beijing (CN); Feifei Zhu, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 527 days.

(21) Appl. No.: 17/802,153

(22) PCT Filed: Nov. 16, 2021

(86) PCT No.: PCT/CN2021/130833
§ 371 (c)(1),
(2) Date: Aug. 25, 2022

(87) PCT Pub. No.: WO2022/166299
PCT Pub. Date: Aug. 11, 2022

(65) Prior Publication Data
US 2023/0363228 A1    Nov. 9, 2023

(30) Foreign Application Priority Data
Feb. 3, 2021   (CN) .......................... 202110148609.3

(51) Int. Cl.
*H10K 59/131*    (2023.01)
*H10K 59/35*    (2023.01)

(52) U.S. Cl.
CPC ......... *H10K 59/353* (2023.02); *H10K 59/131* (2023.02)

(58) Field of Classification Search
CPC .......................... H10K 59/131; H10K 59/353
See application file for complete search history.

(56) References Cited

U.S. PATENT DOCUMENTS

| 2012/0153321 A1 | 6/2012 | Chung et al. |
| 2017/0179441 A1 | 6/2017 | Lee et al. |

(Continued)

FOREIGN PATENT DOCUMENTS

| CN | 107390422 A | 11/2017 |
| CN | 109448575 A | 3/2019 |

(Continued)

OTHER PUBLICATIONS

International Search Report for PCT/CN2021/130833 Mailed Feb. 23, 2022.

(Continued)

*Primary Examiner* — Douglas M Menz
(74) *Attorney, Agent, or Firm* — Ling Wu; Stephen Yang; Ling and Yang Intellectual Property

(57) ABSTRACT

A display substrate and a display device, the display substrate comprising a transparent display area and a non-display area disposed on the periphery of the transparent display area; the transparent display area comprises a base substrate and a plurality of display units which are arranged in an array on the base substrate; the display units each comprise a display area and a first transparent area; the display areas each comprise a plurality of sub-pixels, and each sub-pixel comprises a pixel driving circuit and a light-emitting element; the pixel driving circuits are configured to drive the light-emitting elements to emit light; and the display area is at least partially surrounded by the first transparent area. The display device comprises the display substrate.

16 Claims, 11 Drawing Sheets

(56) References Cited

U.S. PATENT DOCUMENTS

| | | |
|---|---|---|
| 2017/0294488 A1 | 10/2017 | Lin et al. |
| 2018/0136513 A1 | 5/2018 | Liu et al. |
| 2019/0250450 A1 | 8/2019 | Li |
| 2019/0302547 A1 | 10/2019 | Ootsu et al. |
| 2020/0105843 A1* | 4/2020 | Baek .................. H10K 50/813 |
| 2020/0133040 A1 | 4/2020 | Bang et al. |
| 2021/0018781 A1 | 1/2021 | Chen et al. |
| 2021/0134926 A1* | 5/2021 | Song .................. H10K 59/131 |
| 2021/0159286 A1 | 5/2021 | Ma et al. |
| 2021/0280128 A1 | 9/2021 | Shen et al. |
| 2021/0327967 A1 | 10/2021 | Zhang et al. |
| 2021/0327980 A1 | 10/2021 | Tang et al. |
| 2022/0190059 A1* | 6/2022 | Park ................ H10K 59/80515 |

FOREIGN PATENT DOCUMENTS

| | | |
|---|---|---|
| CN | 109582179 A | 4/2019 |
| CN | 110767159 A | 2/2020 |
| CN | 210052743 U | 2/2020 |
| CN | 110867476 A | 3/2020 |
| CN | 110867480 A | 3/2020 |
| CN | 111123593 A | 5/2020 |
| CN | 111341825 A | 6/2020 |
| CN | 112002822 A | 11/2020 |
| CN | 112992991 A | 6/2021 |
| GB | 2588702 A | 5/2021 |
| WO | 2020258867 A1 | 12/2020 |

OTHER PUBLICATIONS

Office Action dated Jul. 1, 2022 for Chinese Patent Application No. 202110148609.3 and English Translation.
Notification to Grant dated Dec. 5, 2022 for Chinese Patent Application No. 202110148609.3 and English Translation.

* cited by examiner

DISPLAY SUBSTRATE AND DISPLAY DEVICE

CROSS-REFERENCE TO RELATED APPLICATIONS

The present application is a U.S. National Phase Entry of International Application No. PCT/CN2021/130833 having an international filing date of Nov. 16, 2021, which claims priority to Chinese Patent Application No. 202110148609.3, filed to the CNIPA on Feb. 3, 2021 and entitled "Display Substrate and Display Apparatus". The entire contents of the above-identified applications are hereby incorporated by reference.

TECHNICAL FIELD

Embodiments of the present disclosure relate to, but are not limited to, the field of display technologies, in particular to a display substrate and a display apparatus.

BACKGROUND

As a new type of light emitting device, an Organic Light Emitting Diode (OLED) has shown great application potential in the fields of display and illumination, and has received strong attention from academia and industry. In the field of display, compared with a Liquid Crystal Display (LCD) apparatus, an OLED display apparatus has advantages of self-luminescence, fast response, a wide viewing angle, high brightness, bright color, lightness and thinness, and the like, and is considered as the next-generation display technology.

With continuous development of display technologies, an OLED display technology, a quantum dot display technology, and the like, are increasingly applied in see-through display. The see-through display is an important personalized display field of the display technologies, which refers to display of an image in a see-through state, and a viewer may not only see the image in a display apparatus, but also see a scene behind the display apparatus. Each pixel of a see-through display apparatus includes a see-through region and a not-see-through region, wherein the non-see-through region realizes image display, and the see-through region realizes light transmission. Some see-through display apparatuses are prone to diffraction effects, which leads to a ghosting phenomenon when viewing a see-through display apparatus, affecting a see-through effect, and with increasing of a pixel density (Pixel Per Inch (PPI)), the smaller a size of each see-through region is, the more serious a corresponding diffraction ghosting phenomenon is, which affects quality of see-through display.

SUMMARY

The following is a summary of subject matters described herein in detail. The summary is not intended to limit the protection scope of claims.

An embodiment of the present disclosure provides a display substrate, including a see-through display region and a non-display region disposed at a periphery of the see-through display region, wherein the see-through display region includes an underlay and multiple display units arranged in an array on the underlay, a display unit includes a display region and a first see-through region, the display region includes multiple sub-pixels, each sub-pixel includes a pixel drive circuit and a light emitting element, the pixel drive circuit is configured to drive the light emitting element to emit light; the display region is at least partially surrounded by the first see-through region.

An embodiment of the present disclosure further provides a display apparatus, including the display substrate according to any embodiment.

Other aspects may be understood upon reading and understanding of drawings and detailed description.

BRIEF DESCRIPTION OF DRAWINGS

The drawings are intended to provide a further understanding of technical solutions of the present disclosure and constitute a part of the specification, and are used for explaining the technical solutions of the present disclosure together with embodiments of the present disclosure, and not intended to form limitations on the technical solutions of the present disclosure. Shapes and sizes of components in the drawings do not reflect actual scales, and are only intended to schematically illustrate contents of the present disclosure.

DETAILED DESCRIPTION

Those of ordinary skills in the art should understand that modifications or equivalent replacements may be made to the technical solutions of the embodiments of the present disclosure without departing from the spirit and scope of the technical solutions of the embodiments of the present disclosure, and should all fall within the scope of the claims of the present disclosure.

Figure 1:
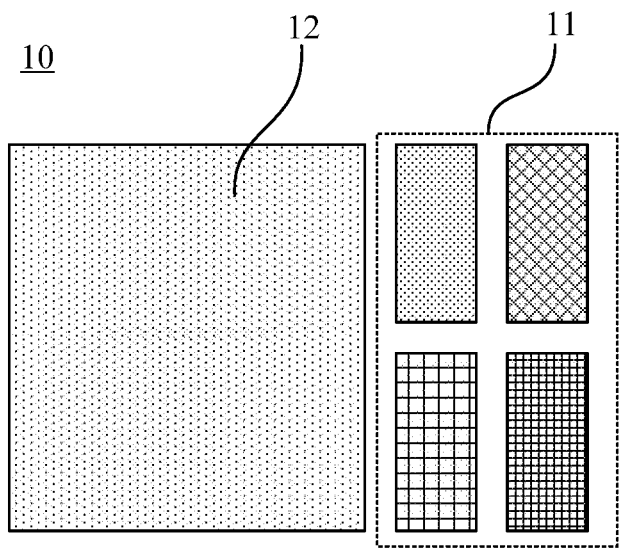
FIG. 1 is a schematic diagram of a structure of a display unit of a see-through display substrate of some technologies.

As shown in FIG. 1, FIG. 1 is a schematic diagram of a structure of a display unit of a see-through display substrate of some technologies. The display substrate includes multiple display units 10 arranged in an array, wherein a display unit 10 includes a display region 11 and a see-through region 12, and the see-through region 12 is located on one side of the display region 11. Herein, in the display substrate, a regular arrangement of display regions 11 and see-through regions 12 will produce a grating structure, and the grating structure is prone to a diffraction effect, which leads to a ghosting phenomenon when viewing a see-through display apparatus, affecting a see-through effect.

Figure 2A:
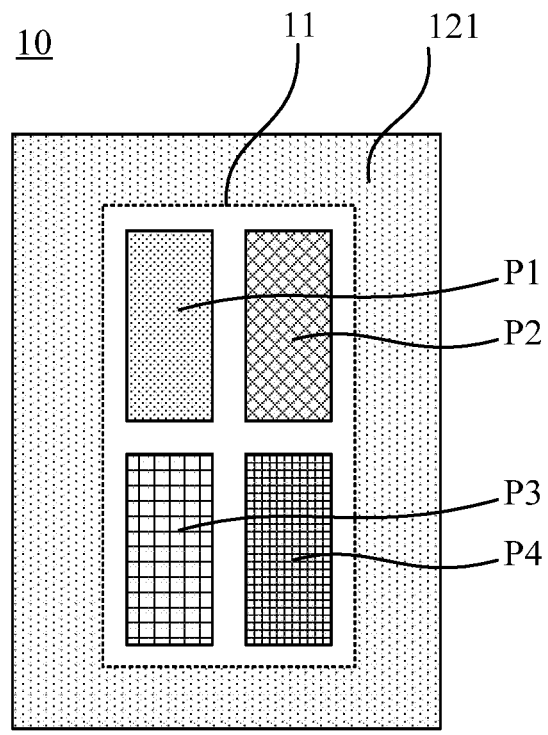
FIG. 2a is a schematic diagram of a structure of a display unit of a display substrate of some exemplary embodiments.
Figure 2B:
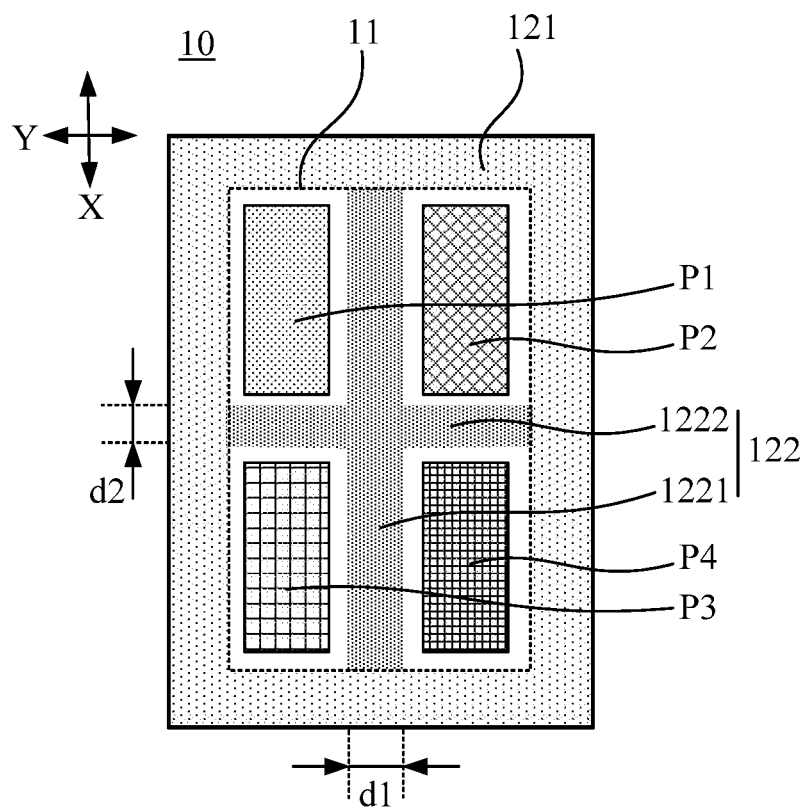
FIG. 2b is a schematic diagram of a structure of a display unit of a display substrate of other exemplary embodiments.
Figure 2C:
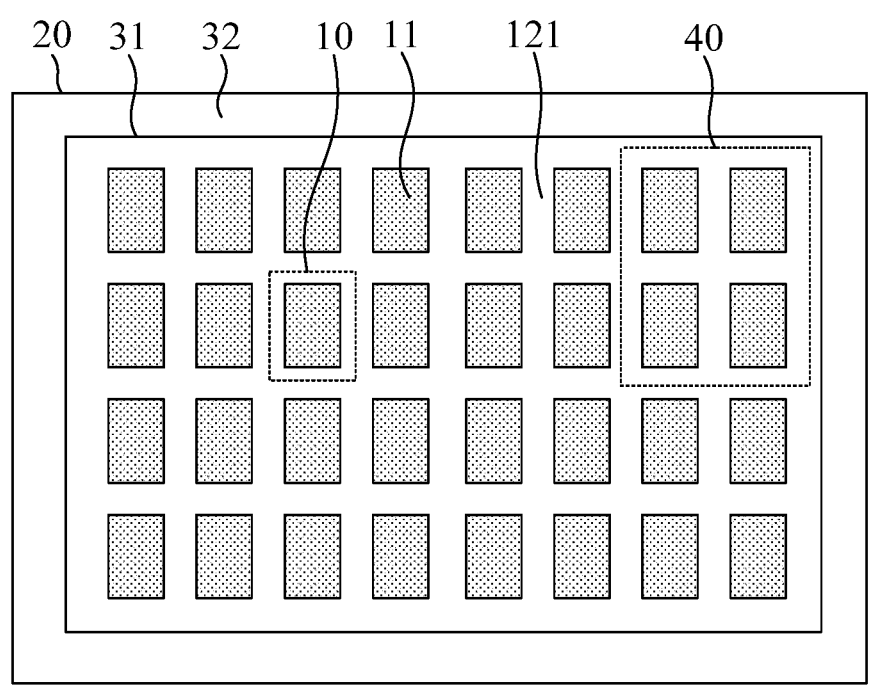
FIG. 2c is a schematic diagram of a structure of a display substrate in which the display unit shown in FIG. 2a is used in some exemplary embodiments.

An embodiment of the present disclosure provides a display substrate, as shown in FIGS. 2a and 2c, wherein FIG. 2a is a schematic diagram of a structure of a display unit of a display substrate of some exemplary embodiments, and FIG. 2c is a schematic diagram of a structure of a display substrate in which the display unit shown in FIG. 2a is used in some exemplary embodiments. The display substrate includes a see-through display region 31 and a non-display region 32 disposed at a periphery of the see-through display region 31, wherein the see-through display region 31 includes an underlay 20 and multiple display units 10 arranged on the underlay 20 in an array, a display unit 10 includes a display region 11 and a first see-through region 121, the display region 11 includes multiple sub-pixels, each sub-pixel includes a pixel drive circuit and a light emitting element, the pixel drive circuit is configured to drive the light emitting element to emit light; the display region 11 is at least partially surrounded by the first see-through region 121.

Diffraction ghosting of the see-through display substrate is caused by a periodic and regular arrangement of see-through regions and non-see-through regions (i.e. display regions) in a horizontal or vertical direction to form a grating structure (an optical device composed of a large quantity of parallel slits with an equal width and an equal pitch), a method of reducing diffraction ghosting may be to increase a size of a see-through region, which will reduce a pixel aperture ratio of the display substrate, or may be to increase a size of a display region, which will reduce a transmittance of the display substrate. For the display substrate of an embodiment of the present disclosure, compared with a solution that a see-through region is disposed only on one side of a display region in some technologies, on a premise of keeping both an area of a see-through region and an area of a display region unchanged, by means of surrounding the display region at least partially through the see-through region (i.e., the first see-through region 121), a pitch between two adjacent display regions 11 in a horizontal or vertical direction may be reduced (a size of a see-through region between the two adjacent display regions 11 in the horizontal or vertical direction is reduced). Thereby, according to the display substrate of the embodiment of the present disclosure, a ghosting phenomenon caused by a diffraction effect may be reduced to a certain extent, improving a see-through display effect.

In the display substrate of the embodiment of the present disclosure, an image may be displayed in the see-through display region 31 and light transmission (a light transmittance is relatively high) may be achieved. The non-display region 32 may be referred to as a frame region, and is configured for disposing a peripheral circuit, wherein the peripheral circuit may include a light emitting control circuit and a gate drive circuit, etc. An image cannot be displayed in the non-display region 32, and the non-display region 32 may be opaque (or a light transmittance is relatively low).

In some exemplary embodiments, as shown in FIGS. 2a and 2c, the display region 11 includes a first side and a second side which are opposite, and a third side and a fourth side which are opposite, and the first see-through region 121 is disposed on four sides of the display region 11. As shown in FIG. 2c, a first see-through region 121 is disposed between display regions 11 of two adjacent display units 10.

In some exemplary embodiments, as shown in FIG. 2a, the display region 11 may include four sub-pixels arranged in two rows and two columns, wherein the four sub-pixels are a first sub-pixel P1, a second sub-pixel P2, a third sub-pixel P3, and a fourth sub-pixel P4, respectively. Each sub-pixel includes a pixel drive circuit and a light emitting element, wherein the light emitting element may include another light emitting device such as an OLED device or a quantum dot light emitting device. The OLED device includes: an anode, a cathode, and an organic emitting layer located between the anode and the cathode. The light emitting element may emit light of a set color under driving of the pixel drive circuit. The display unit 10 is a smallest unit for image display, and one display unit 10 may be referred to as one pixel. The display unit 10 may be enabled to display a desired color by adjusting light brightness of each sub-pixel within the display unit 10. In some examples, the first sub-pixel P1 is set to emit blue light, the second sub-pixel P2 is set to emit green light, the third sub-pixel P3 is set to emit white light, and the fourth sub-pixel P4 is set to emit red light. In another example, two of the four sub-pixels may be set to emit red light and green light respectively, and the other two sub-pixels may be all set to emit blue light. In another example, multiple sub-pixels within the display region 11 may be disposed in parallel, i.e. arranged in a row. In another example, a quantity of sub-pixels of the display region 11 may be three, and the three sub-pixels may be set to emit red light, green light, and blue light, respectively, which may be applied to a printing OLED panel, a vapor deposition OLED panel, a quantum dot display panel, or the like. In an embodiment of the present disclosure, there is no restriction on a quantity and an arrangement mode of sub-pixels of the display region 11 of each display unit 10, and light emitting colors of the sub-pixels, etc. In some examples, a shape of the display region 11 may be a rectangle, a circle, or the like, and an edge shape of the first see-through region 121 may be a rectangle, a circle, or the like. There is no restriction on shapes of the display region 11 and the first see-through region 121 in the embodiment of the present disclosure.

Figure 2D:
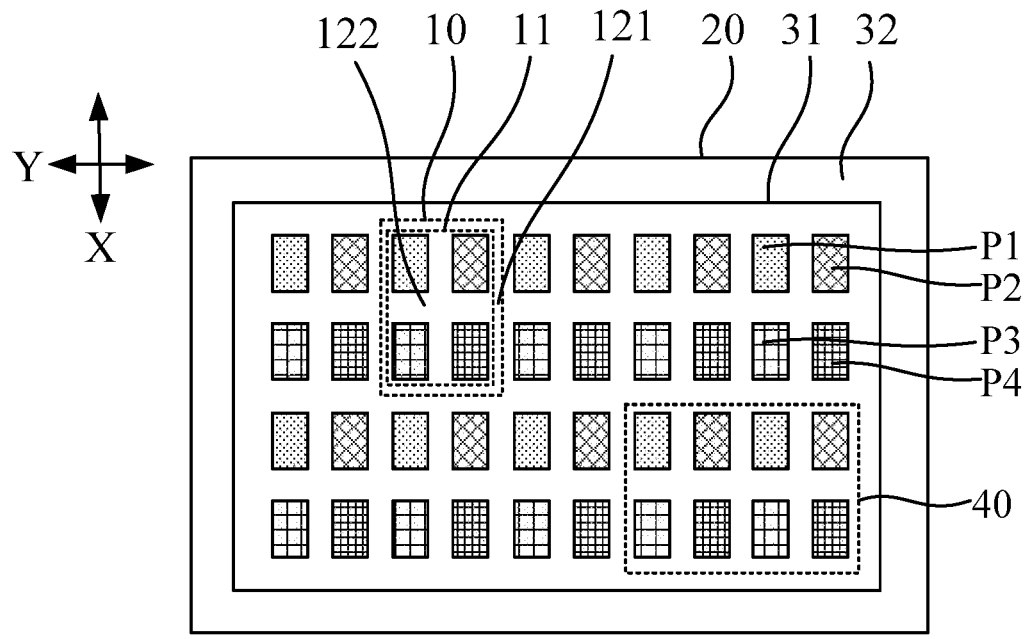
FIG. 2d is a schematic diagram of a structure of a display substrate in which the display unit shown in FIG. 2b is used in other exemplary embodiments.

In some exemplary embodiments, the display region may further include a second see-through region, wherein the second see-through region is disposed between at least two adjacent sub-pixels. The second see-through region includes a first region extending along a first direction, wherein the first region is located between two adjacent sub-pixel columns or two adjacent sub-pixel rows. In an example of this embodiment, as shown in FIGS. 2b and 2d, FIG. 2b is a schematic diagram of a structure of a display unit of a display substrate of other exemplary embodiments, and FIG. 2d is a schematic diagram of a structure of multiple display units shown in FIG. 2b arranged in an array on an underlay. The display region 11 further includes a second see-through region 122, wherein the second see-through region 122 may include a first region 1221 extending along a first direction X (a vertical direction in the figure), and the first region 1221 may be located in a region between two columns of sub-pixels (i.e., between two sub-pixel columns). The second see-through region 122 may further include a second region 1222 extending along a second direction Y (a horizontal direction in the figure), wherein the first direction X intersects the second direction Y, and the second region 1222 may be located in a region between two rows of sub-pixels (i.e., between two sub-pixel rows). In FIG. 2b, the first sub-pixel P1 and the third sub-pixel P3 are located in one sub-pixel column, and the second sub-pixel P2 and the fourth sub-pixel P4 are located in another sub-pixel column; the first sub-pixel P1 and the second sub-pixel P2 are located in one sub-pixel row, and the third sub-pixel P3 and the fourth sub-pixel P4 are located in another sub-pixel row. In each display unit 10, a width d1 of the first region 1221 and a width d2 of the second region 1222 may be the same or different. Each sub-pixel is at least partially surrounded by the first see-through region 121 and the second see-through region 122, i.e. each of four sides of each sub-pixel is provided with a first see-through region 121 or a second see-through region 122. For example, a first see-through region 121 is disposed on a left side and an upper side of the first sub-pixel P1, and a second see-through region 122 is disposed on a right side and a lower side of the first sub-pixel P1, wherein the first sub-pixel P1 (except for a small quantity of signal lines between sub-pixels) is almost entirely surrounded by the first see-through region 121 and the second see-through region 122. In another example, the second see-through region 122 may include a first region 1221 and not include a second region 1222; or the second see-through region 122 may include a second region 1222 and not include a first region 1221.

Herein, a "first direction" and a "second direction" are shown in drawings of some examples, but there is no restriction on the "first direction" and the "second direction" in the embodiment of the present disclosure.

In this example, a second see-through region 122 is disposed between sub-pixels within the display region 11, and the first see-through region 121 intersects the second see-through region 122. When light passes through the first see-through region 121 and the second see-through region 122, diffraction fringes generated may spread in multiple directions, which may reduce a diffraction ghosting phenomenon.

In an embodiment of the present disclosure, the display region 11 is configured to achieve image display and cannot transmit background light on a back side of the display substrate or a transmittance of the background light is relatively small. The first see-through region 121 and the second see-through region 122 may be collectively referred to as a see-through region, configured to achieve light transmission, and may transmit the background light on the back side of the display substrate. A light transmittance of the see-through region may be more than 70%, for example, 80%, 90%.

In some exemplary embodiments, as shown in FIGS. 2c and 2d, since a light transmittance of the see-through display region 31 is relatively high, an under display optical module may be disposed in the see-through display region 31, wherein the under display optical module may be an under display camera, an under display infrared sensor, or the like. The under display optical module may be disposed at any position in a region, corresponding to the see-through display region 31, on the backlight side of the display substrate, for example, at a position of the see-through display region 31 close to the non-display region 32, or at an intermediate position of the see-through display region 31. In examples of FIGS. 2c and 2d, a position at which an under display optical module is located is a position indicated by a reference numeral 40. The position at which the under display optical module is located may include multiple display units 10, which may ensure having relatively good light transmittance and may perform image display.

In some exemplary embodiments, in a direction perpendicular to the display substrate, the display substrate includes a drive structure layer, a light emitting structure layer, and an encapsulation structure layer which are sequentially stacked on an underlay. The drive structure layer includes the pixel drive circuit, the light emitting structure layer includes multiple light emitting elements connected with the pixel drive circuit, the encapsulation structure layer may be encapsulated using a thin film, and the encapsulation structure layer may isolate the light emitting elements from the outside, which avoids water and oxygen in the air from invading the light emitting elements, prolonging service life of the display substrate.

Figure 3:
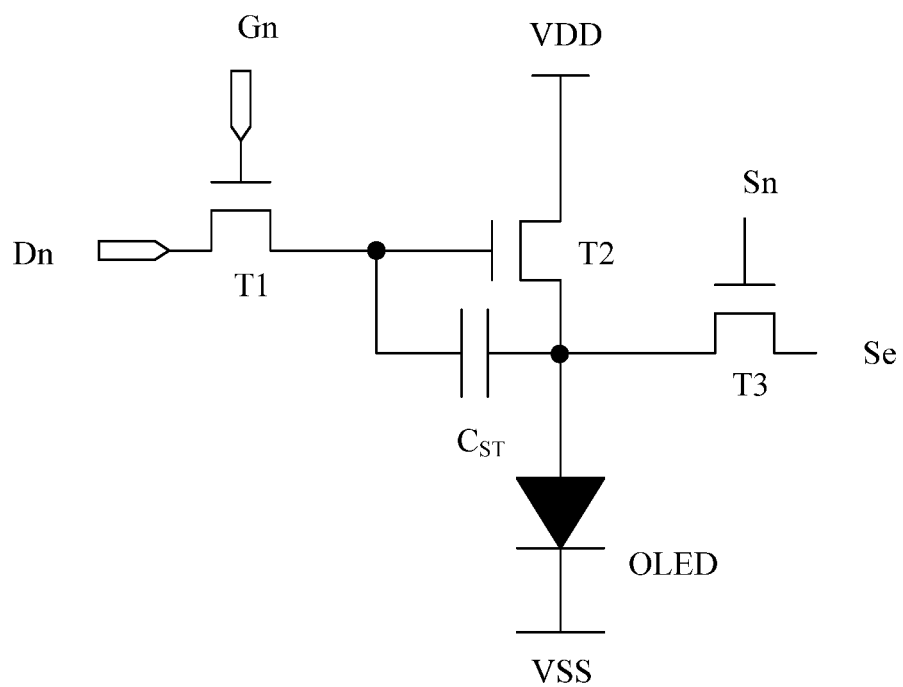
FIG. 3 is a schematic diagram of an equivalent circuit of a pixel drive circuit of a display substrate of some exemplary embodiments.

In some exemplary embodiments, each sub-pixel of the display region 11 of the display unit 10 includes a pixel drive circuit and a light emitting element. The pixel drive circuit of each sub-pixel is configured to connect the light emitting element and drive the light emitting element to emit light. The light emitting element may include an OLED device or a quantum dot light emitting device, etc. For example, in this example, the light emitting element is an OLED device. A structure of 3T1C, 4T1C, 5T1C, 5T2C, 6T1C, or 7T1C, etc. may be used for the pixel drive circuit. FIG. 3 is a schematic diagram of an equivalent circuit of a pixel drive circuit in which a 3T1C structure is used. As shown in FIG. 3, the pixel drive circuit includes a first transistor T1, a second transistor T2, a third transistor T3, a storage capacitor $C_{ST}$, a data line Dn, a first power supply line VDD, a second power supply line VSS, a compensation line Se, a first scan line Gn, and a second scan line Sn. The first transistor T1 is a switching transistor, the second transistor T2 is a drive transistor, and the third transistor T3 is a compensation transistor. A gate electrode of the first transistor T1 is connected with the first scan line Gn, a first electrode of the first transistor T1 is connected with the data line Dn, and a second electrode of the first transistor T1 is connected with a gate electrode of the second transistor T2. The first transistor T1 is used for receiving, under control of the first scan line Gn, a data signal transmitted by the data line Dn, so that the gate electrode of the second transistor T2 receives the data signal. The gate electrode of the second transistor T2 is connected with the second electrode of the first transistor T1, a first electrode of the second transistor T2 is connected with the first power supply line VDD, and a second electrode of the second transistor T2 is connected with a first electrode of an OLED. The second transistor T2 is used for generating, under control of the data signal received by its gate electrode, a corresponding current at its second electrode. A gate electrode of the third transistor T3 is connected with the second scan line Sn, a first electrode of the third transistor T3 is connected with the compensation line Se, and a second electrode of the third transistor T3 is connected with the second electrode of the second transistor T2. The third transistor T3 is used for extracting a threshold voltage Vth and a mobility of the second transistor T2 in response to a compensation timing so as to compensate the threshold voltage Vth. A first electrode of the OLED is connected with the second electrode of the second transistor T2, and a second electrode of the OLED is connected with the second power supply line VSS. The OLED is used for emitting light with corresponding brightness in response to the current of the second electrode of the second transistor T2. A first electrode of the storage capacitor $C_{ST}$ is connected with the gate electrode of the second transistor T2, and a second electrode of the storage capacitor $C_{ST}$ is connected with the second electrode of the second transistor T2. The storage capacitor $C_{ST}$ is used for storing a potential of the gate electrode of the second transistor T2. In some possible implementation modes, a voltage of the first power supply line VDD may be greater than a voltage of the second power supply line VSS, and a maximum voltage of the data signal transmitted by the data line Dn is less than a maximum voltage of the first scan line and is less than the voltage of the first power supply line VDD.

In some exemplary embodiments, the see-through display region includes multiple first signal lines extending along a first direction (which may be a vertical direction in the figure) and multiple second signal lines extending along a second direction (which may be a horizontal direction in the figure), wherein the multiple first signal lines and the multiple second signal lines intersect to define multiple display regions 11 and multiple first see-through regions 121. The first direction may be a vertical direction and the second direction may be a horizontal direction. A first signal line may include a data line Dn, a first power supply line VDD, a second power supply line VSS, and a compensation line Se, and a second signal line may include a first scan line Gn and a second scan line Sn.

Figure 4A:
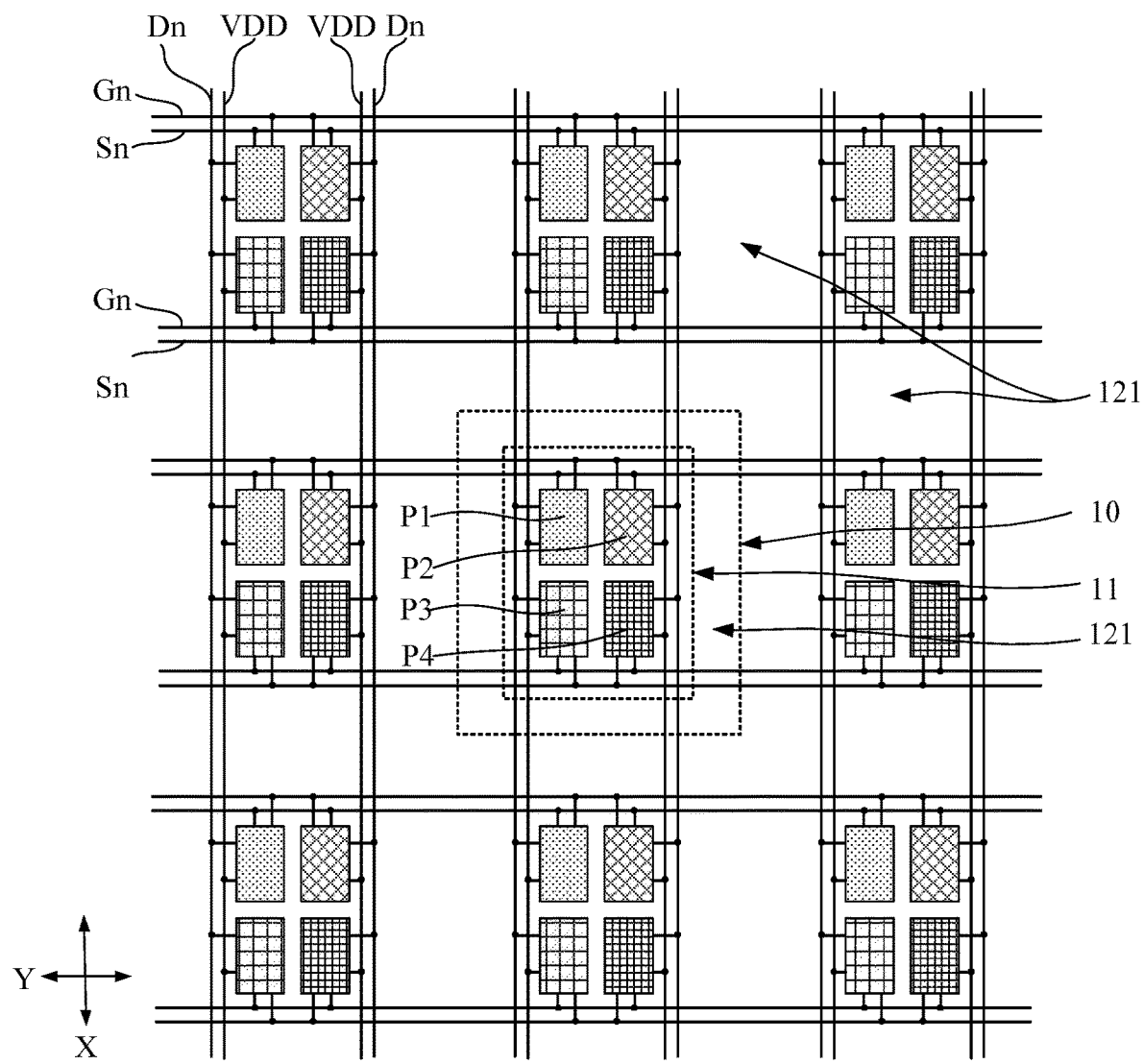
FIG. 4a is a schematic diagram of a structure of a see-through display region of a display substrate of some exemplary embodiments.

In some exemplary embodiments, as shown in FIG. 4a, FIG. 4a is a schematic diagram of a structure of a see-through display region of a display substrate. The see-through display region includes multiple display units 10 arranged in an array on an underlay, wherein each display unit 10 includes a display region 11 and a first see-through region 121. The display region 11 may be rectangular, and the display region 11 includes four sub-pixels arranged in two rows and two columns, wherein the four sub-pixels are a first sub-pixel P1, a second sub-pixel P2, a third sub-pixel P3, and a fourth sub-pixel P4, respectively. Each sub-pixel includes a pixel drive circuit and a light emitting element, wherein the pixel drive circuit is configured to drive the light emitting element to emit light. The display region 11 includes a first side and a second side which are opposite, and a third side and a fourth side which are opposite. The first see-through region 121 is disposed on four sides of the display region 11, and a periphery of each display region 11 is almost entirely surrounded by the first see-through region 121 except for a small quantity of signal lines between two adjacent display regions 11. In the display substrate shown in FIG. 4a, it may be seen that the first see-through region 121 is disposed between display regions 11 of two adjacent display units 10, or that the first see-through region 121 is divided into multiple small-block regions by first signal lines and second signal lines along a first direction X or a second direction Y on the display substrate. In this example, the second see-through region described above is not disposed within the display region 11 of each display unit 10. Compared with a solution that a see-through region is disposed only on one side of a display region in some technologies, for the display substrate of this example, a pitch between two adjacent display regions 11 in a horizontal or vertical direction may be reduced (a size of a see-through region between the two adjacent display regions 11 in the horizontal or vertical direction is reduced), which may, on a premise of keeping both an area of a see-through region and an area of a display region unchanged, reduce a ghosting phenomenon caused by a diffraction effect to a certain extent, and improve a see-through display effect.

For one display unit 10, the display unit 10 includes two data lines Dn and two first power supply lines VDD disposed vertically (in an X direction in the figure), wherein the two data lines Dn are respectively located on a first side and a second side of the display region 11, and the two first power supply lines VDD are respectively located on the first side (the first side is a left side in the figure) and the second side (the second side is a right side in the figure) of the display region 11. One data line Dn thereof is connected with first electrodes of first transistors of pixel drive circuits of a first sub-pixel P1 and a third sub-pixel P3 close to the first side of the display region 11, and the other data line Dn is connected with first electrodes of first transistors of pixel drive circuits of a second sub-pixel P2 and a fourth sub-pixel P4 close to the second side of the display region 11. One first power supply line VDD thereof is connected with first electrodes of second transistors of the pixel drive circuits of the first sub-pixel P1 and the third sub-pixel P3 close to the first side of the display region 11, and the other first power supply line VDD is connected with first electrodes of second transistors of the pixel drive circuits of the second sub-pixel P2 and the fourth sub-pixel P4 close to the second side of the display region 11. The display unit 10 may further include a second power supply line and a compensation line which are disposed vertically, wherein two second power supply lines and two compensation lines may be set, and wiring modes of the second power supply line and the compensation line may both be the same as a wiring mode of the first power supply line VDD.

The display unit 10 may further include two first scan lines Gn and two second scan lines Sn disposed horizontally (in a Y direction in the figure), one first scan line Gn thereof and one second scan line Sn thereof may both be located on a third side of the display region 11 (the third side is an upper side in the figure), and the other first scan line Gn and the other second scan line Sn may both be located on a fourth side of the display region 11 (the fourth side is a lower side in the figure). The first scan line Gn located on the third side of the display region 11 is connected with gate electrodes of first transistors of pixel drive circuits of a first sub-pixel P1 and a second sub-pixel P2 close to the third side of the display region 11. The second scan line Sn located on the third side of the display region 11 is connected with gate electrodes of third transistors of the pixel drive circuits of the first sub-pixel P1 and the second sub-pixel P2 close to the third side of the display region 11. The first scan line Gn located on the fourth side of the display region 11 is connected with gate electrodes of first transistors of pixel drive circuits of a third sub-pixel P3 and a fourth sub-pixel P4 close to the fourth side of the display region 11. The second scan line Sn located on the fourth side of the display region 11 is connected with gate electrodes of third transistors of the pixel drive circuits of the third sub-pixel P3 and the fourth sub-pixel P4 close to the fourth side of the display region 11. In another example, a first scan line Gn and a second scan line Sn may be located on an upper side and a lower side of a sub-pixel row, respectively.

Figure 4B:
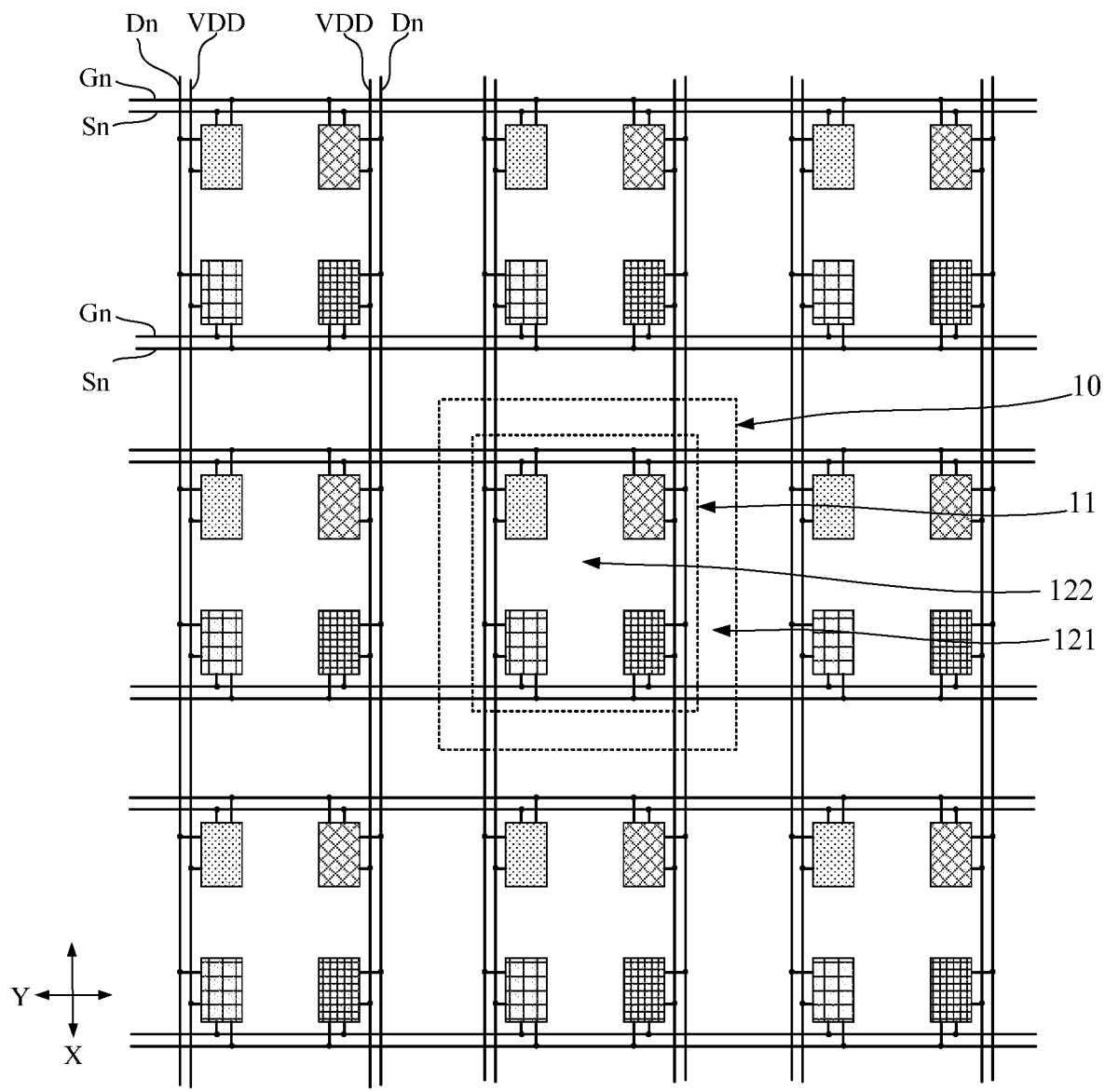
FIG. 4b is a schematic diagram of a structure of a see-through display region of a display substrate of other exemplary embodiments.

In some exemplary embodiments, as shown in FIG. 4b, FIG. 4b is a schematic diagram of a structure of a see-through display region of another display substrate. The see-through display region includes multiple display units 10 arranged in an array on an underlay, wherein a display unit 10 includes a display region 11 and a first see-through region 121, and the first see-through region 121 is disposed on four sides of the display region 11. The display region 11 includes four sub-pixels, and further includes a second see-through region 122 located between adjacent sub-pixels.

The second see-through region 122 includes a first region (shown in FIG. 2b) extending along a first direction (which may be a vertical direction X in the figure) and a second region (shown in FIG. 2b) extending along a second direction (which may be a horizontal direction Y in the figure), wherein the first direction intersects the second direction. A see-through region (a first see-through region 121 or a second see-through region 122) is provided on four sides of each sub-pixel, and each sub-pixel is almost entirely surrounded by the first see-through region 121 and the second see-through region 122 except for a small quantity of signal lines between two adjacent display regions 11. In the display substrate shown in FIG. 4b, it may be seen that along the first direction or the second direction, a see-through region (a region composed of a first see-through region 121 and a second see-through region 122) is divided into multiple small-block regions by first signal lines and second signal lines.

In this example, an arrangement mode of signal lines of each display unit 10 may be the same as a wiring mode exemplified in FIG. 4a. In another example, the second see-through region 122 may include the first region extending along the first direction and not include the second region, or the second see-through region 122 may include the second region extending along the second direction and not include the first region. In the display substrate of this example, a second see-through region 122 is disposed between sub-pixels within the display region 11, and the first see-through region 121 intersects the second see-through region 122. When light passes through the first see-through region 121 and the second see-through region 122, diffraction fringes generated may spread toward multiple directions, which may reduce a diffraction ghosting phenomenon.

Figure 5A:
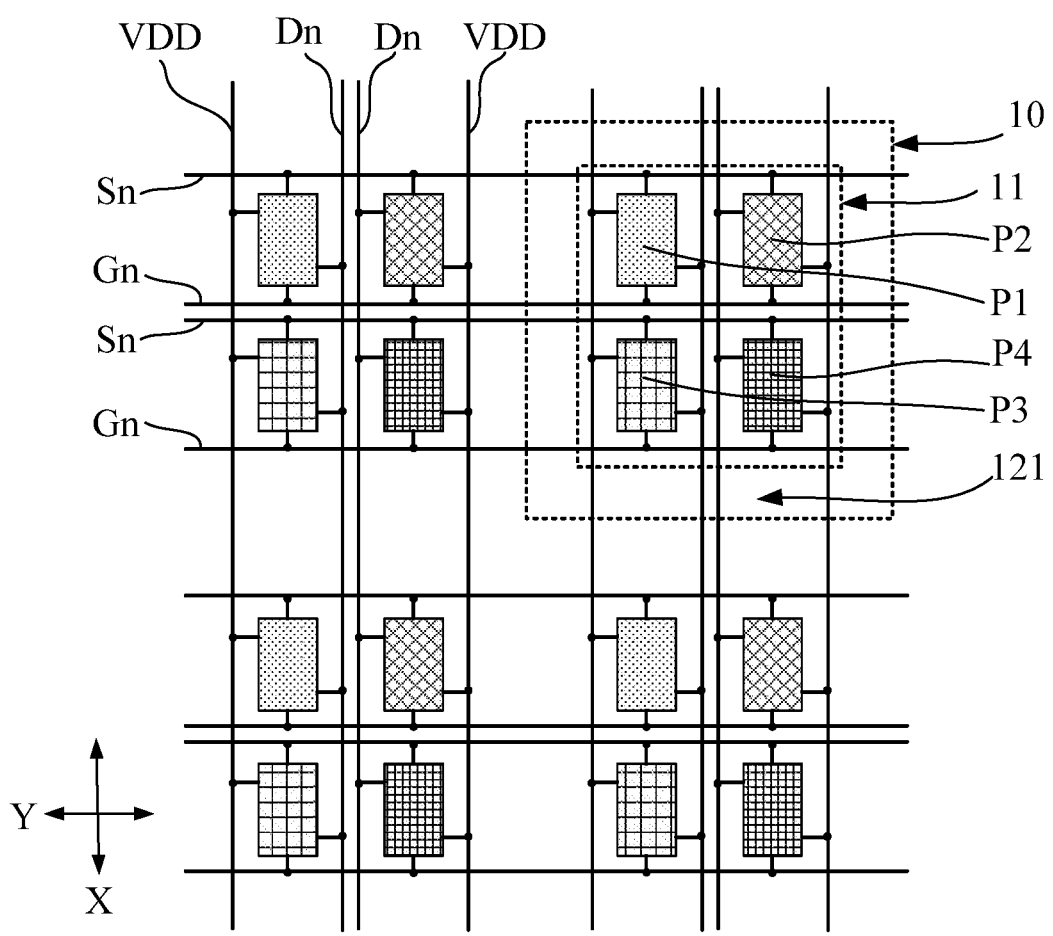
FIG. 5a is a schematic diagram of a structure of a see-through display region of a display substrate of other exemplary embodiments.

In some exemplary embodiments, as shown in FIG. 5a, FIG. 5a is a schematic diagram of a structure of a see-through display region of another display substrate. The see-through display region includes multiple display units 10 arranged in an array on an underlay, and each display unit 10 includes a display region 11 and a first see-through region 121. The display region 11 may be rectangular, and the display region 11 includes four sub-pixels arranged in two rows and two columns, wherein the four sub-pixels are a first sub-pixel P1, a second sub-pixel P2, a third sub-pixel P3, and a fourth sub-pixel P4, respectively. Each sub-pixel includes a pixel drive circuit and a light emitting element, wherein the pixel drive circuit is configured to drive the light emitting element to emit light. The display region 11 includes a first side and a second side which are opposite, and a third side and a fourth side which are opposite. The first see-through region 121 is disposed on four sides of the display region 11, and a periphery of each display region 11 is almost entirely surrounded by the first see-through region 121 except for a small quantity of signal lines between two adjacent display regions 11. In the display substrate exemplified in FIG. 5a, it may be seen that along a first direction X or a second direction Y, a first see-through region 121 is divided into multiple small-block regions by first signal lines and second signal lines. Compared with a solution that a see-through region is disposed only on one side of a display region in some technologies, for the display substrate of this example, on a premise of keeping both an area of a see-through region and an area of a display region unchanged, a ghosting phenomenon caused by a diffraction effect may be reduced to a certain extent, and a see-through display effect may be improved.

For one display unit 10, the display unit 10 includes two data lines Dn and two first power supply lines VDD which are disposed vertically (in the X direction in the figure). The two first power supply lines VDD are respectively located on the first side and the second side of the display region 11, and the two data lines Dn are located between the two first power supply lines VDD, one sub-pixel column (including the first sub-pixel P1 and the third sub-pixel P3) is defined between a first power supply line VDD located on the first side of the display region 11 and a data line Dn close to the first side of the display region 11, and another sub-pixel column (including the second sub-pixel P2 and the fourth sub-pixel P4) is defined between a first power supply line VDD located on the second side of the display region 11 and a data line Dn close to the second side of the display region 11. Each data line Dn is connected with a first electrode of a first transistor of a pixel drive circuit of each sub-pixel of a sub-pixel column close to the data line Dn. Each first power supply line VDD is connected with a first electrode of a second transistor of a pixel drive circuit of each sub-pixel of a sub-pixel column close to the first power supply line VDD. The display unit 10 may further include a second power supply line and a compensation line which are disposed vertically, wherein two second power supply lines and two compensation line may be set, and wiring modes of the second power supply line and the compensation line may both be the same as a wiring mode of the first power supply line VDD. In another example, the two data lines Dn may be respectively located on the first side and the second side of the display region 11, and the two first power supply lines VDD are located between the two data lines Dn, one sub-pixel column is defined between a data line Dn located on the first side of the display region 11 and a first power supply line VDD close to the first side of the display region 11, and another sub-pixel column is defined between a data line Dn located on the second side of the display region 11 and a first power supply line VDD close to the second side of the display region 11.

The display unit 10 may further include two first scan lines Gn and two second scan lines Sn disposed horizontally (in the Y direction in the figure), wherein one sub-pixel row may be defined by one first scan line Gn and one second scan line Sn. Exemplarily, one second scan line Sn thereof is located on the third side of the display region 11, and one first scan line Gn thereof is located on the fourth side of the display region 11, one sub-pixel row defined by the second scan line Sn located on the third side of the display region 11 and another first scan line Gn includes a first sub-pixel P1 and a second sub-pixel P2, and one sub-pixel row defined by the first scan line Gn located on the fourth side of the display region 11 and another second scan line Sn includes a third sub-pixel P3 and a fourth sub-pixel P4. Each first scan line Gn is connected with a gate electrode of a first transistor of a pixel drive circuit of each sub-pixel of one corresponding sub-pixel row. Each second scan line Sn is connected with a gate electrode of a third transistor of a pixel drive circuit of each sub-pixel of one corresponding sub-pixel row. In another example, a first scan line Gn and a second scan line Sn may both be located on an upper side or a lower side of one corresponding sub-pixel row.

Figure 5B:
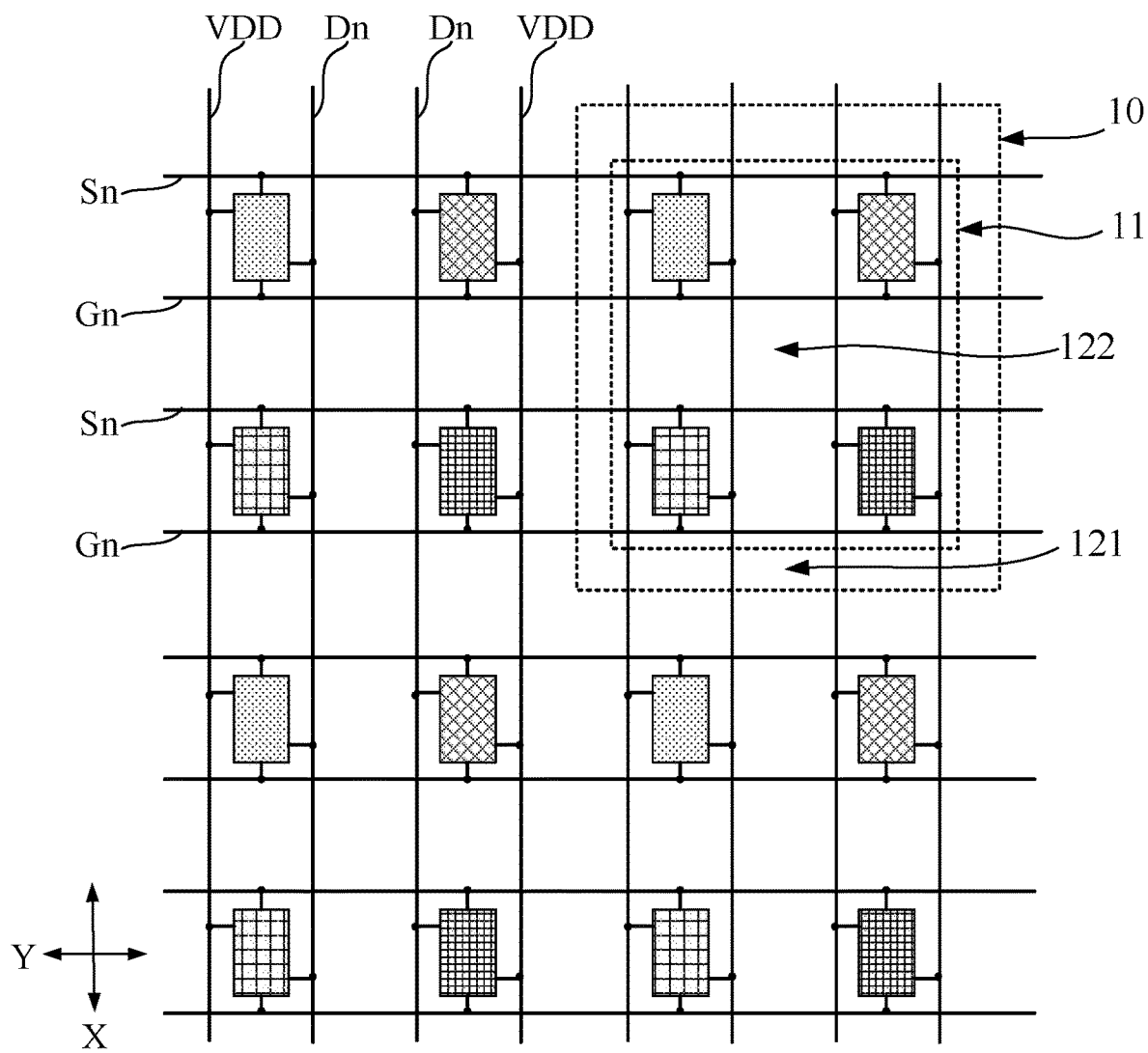
FIG. 5b is a schematic diagram of a structure of a see-through display region of a display substrate of other exemplary embodiments.

In some exemplary embodiments, as shown in FIG. 5b, FIG. 5b is a schematic diagram of a structure of a see-through display region of another display substrate. The see-through display region includes multiple display units 10 arranged in an array on an underlay, wherein a display unit 10 includes a display region 11 and a first see-through region 121, and the first see-through region 121 is disposed on four sides of the display region 11. The display region 11 includes four sub-pixels, and further includes a second see-through region 122 located between adjacent sub-pixels. The second see-through region 122 includes a first region extending along a first direction (which may be a vertical direction X in the figure) and a second region extending along a second direction (which may be a horizontal direction Y in the figure), wherein the first direction intersects the second direction. A see-through region (a first see-through region 121 or a second see-through region 122) is provided on four sides of each sub-pixel, and each sub-pixel is almost entirely surrounded by the first see-through region 121 and the second see-through region 122 except for a small quantity of signal lines between two adjacent display regions 11. In the display substrate shown in FIG. 5b, along the first direction or the second direction, it may be seen that a see-through region (a region composed of a first see-through region 121 and a second see-through region 122) is divided into multiple small-block regions by first signal lines and second signal lines. In the display substrate of this example, a second see-through region 122 is disposed between sub-pixels within the display region 11, and the first see-through region 121 intersects the second see-through region 122. When light passes through the first see-through region 121 and the second see-through region 122, diffraction fringes generated may spread toward multiple directions, which may reduce a diffraction ghosting phenomenon. In this example, an arrangement mode of signal lines of each display unit 10 may be the same as a wiring mode exemplified in FIG. 5a, for example, the two first power supply lines VDD are respectively located on the first side and the second side of the display region 11, and the two data lines Dn are located between the two first power supply lines VDD. Herein, a first region of a second see-through region 122 of each display unit 10 may be located between two data lines Dn, and a second region of the second see-through region 122 of each display unit 10 may be located between the first scan line Gn and the second scan line Sn. In the display substrate exemplified in FIG. 5b, it may be seen that a first-direction see-through region extending along the first direction is disposed between adjacent sub-pixel columns, and a second-direction see-through region is disposed between adjacent sub-pixel rows. The first-direction see-through region and the second-direction see-through region are divided into multiple small-block see-through regions by multiple first signal lines extending along the first direction and multiple second signal lines extending along the second direction. In another example, the second see-through region 122 may include the first region extending along the first direction and not include the second region, or the second see-through region 122 may include the second region extending along the second direction and not include the first region.

Figure 6A:
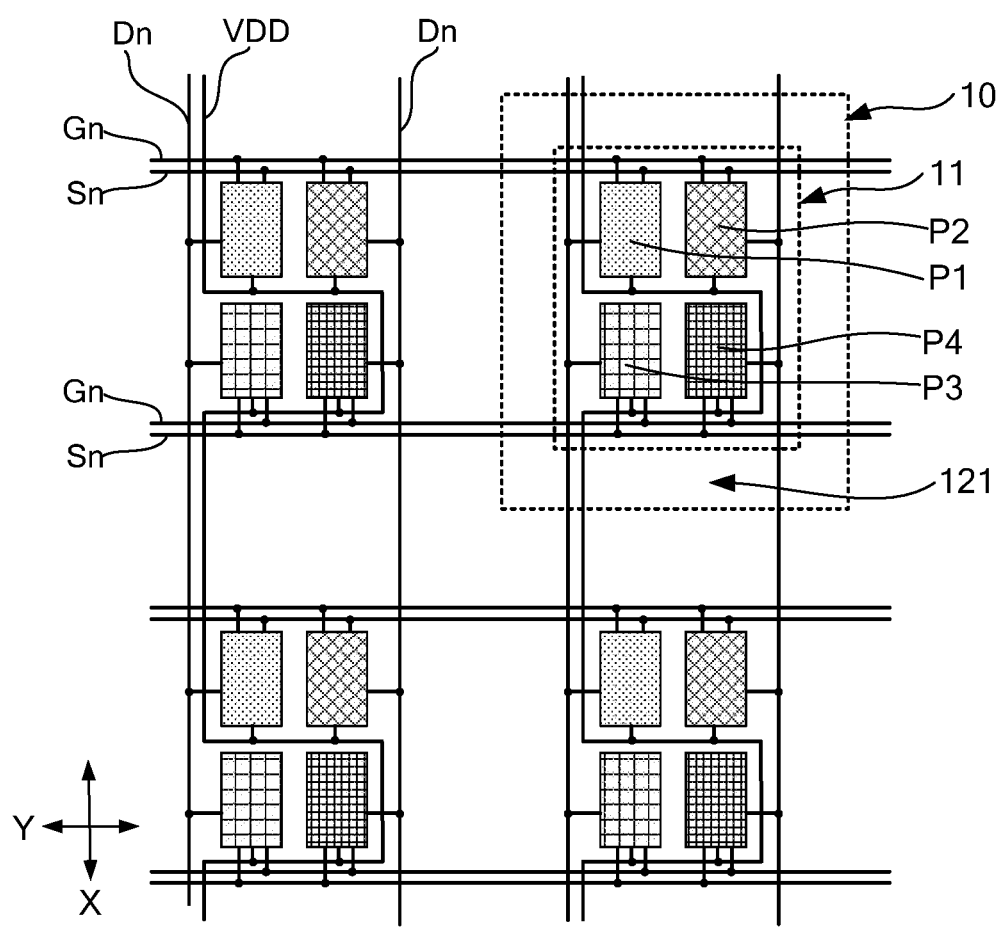
FIG. 6a is a schematic diagram of a structure of a see-through display region of a display substrate of other exemplary embodiments.

In some exemplary embodiments, as shown in FIG. 6a, FIG. 6a is a schematic diagram of a structure of a see-through display region of another display substrate. The see-through display region includes multiple display units 10 arranged in an array on an underlay, wherein each display unit 10 includes a display region 11 and a first see-through region 121. The display region 11 may be rectangular, and the display region 11 includes four sub-pixels arranged in two rows and two columns, wherein the four sub-pixels are a first sub-pixel P1, a second sub-pixel P2, a third sub-pixel P3, and a fourth sub-pixel P4, respectively. The display region 11 includes a first side and a second side which are opposite, and a third side and a fourth side which are opposite. The first see-through region 121 is disposed on four sides of the display region 11, and a periphery of each display region 11 is almost entirely surrounded by the first see-through region 121 except for a small quantity of signal lines between two adjacent display regions 11. In the display substrate exemplified in FIG. 6a, along the first direction X or the second direction Y, it may be seen that the first see-through region 121 is divided into multiple small-block regions by first signal lines and second signal lines. Compared with a solution that a see-through region is disposed only on one side of a display region in some technologies, for the display substrate of this example, on a premise of keeping both an area of a see-through region and an area of a display region unchanged, a ghosting phenomenon caused by a diffraction effect may be reduced to a certain extent, improving a see-through display effect.

The display unit 10 may include two data lines Dn and one first power supply line VDD disposed vertically (in an X direction in the figure), wherein the two data lines Dn are located on the first side and the second side of the display region 11, respectively, and the first power supply line VDD is located between the two data lines Dn. In the display unit 10, the first power supply line VDD includes a first line segment extending along the first direction (shown as extending vertically downward) from a first end (shown as an upper end), a second line segment having one end connected with the first line segment and the other end extending along the second direction (shown as extending horizontally to the right), a third line segment having one end connected with the second line segment and the other end extending along the first direction, a fourth line segment having one end connected with the third line segment and the other end extending along the second direction, and a fifth line segment having one end connected with the fourth line segment and the other end extending along the first direction; the first line segment and the fifth line segment are both close to one of the two data lines Dn, and the third line segment is close to the other of the two data lines Dn. The first power supply line VDD is connected with a first electrode of a second transistor of a pixel drive circuit of each sub-pixel of the display region 11. Each data line Dn is connected with a first electrode of a first transistor of a pixel drive circuit of each sub-pixel of a sub-pixel column close to the data line Dn. The display unit 10 may further include a second power supply line and a compensation line, wherein one second power supply line and one compensation line may be set, and wiring modes of the second power supply line and the compensation line may both be the same as a wiring mode of the first power supply line VDD.

The display unit 10 may further include two first scan lines Gn and two second scan lines Sn disposed horizontally (in a Y direction in the figure), one first scan line Gn thereof and one second scan line Sn thereof may both be located on the third side of the display region 11, and the other first scan line Gn and the other second scan line Sn may both be located on the fourth side of the display region 11. The first scan line Gn located on the third side of the display region 11 is connected with gate electrodes of first transistors of pixel drive circuits of a first sub-pixel P1 and a second sub-pixel P2 close to the third side of the display region 11. The second scan line Sn located on the third side of the display region 11 is connected with gate electrodes of third transistors of the pixel drive circuits of the first sub-pixel P1 and the second sub-pixel P2 close to the third side of the display region 11. The first scan line Gn located on the fourth side of the display region 11 is connected with gate electrodes of first transistors of pixel drive circuits of a third sub-pixel P3 and a fourth sub-pixel P4 close to the fourth side of the display region 11. The second scan line Sn located on the fourth side of the display region 11 is connected with gate electrodes of third transistors of the pixel drive circuits of the third sub-pixel P3 and the fourth sub-pixel P4 close to the fourth side of the display region 11. In another example, the first scan line Gn and the second scan line Sn may be located on an upper side and a lower side of a sub-pixel row, respectively.

Figure 6B:
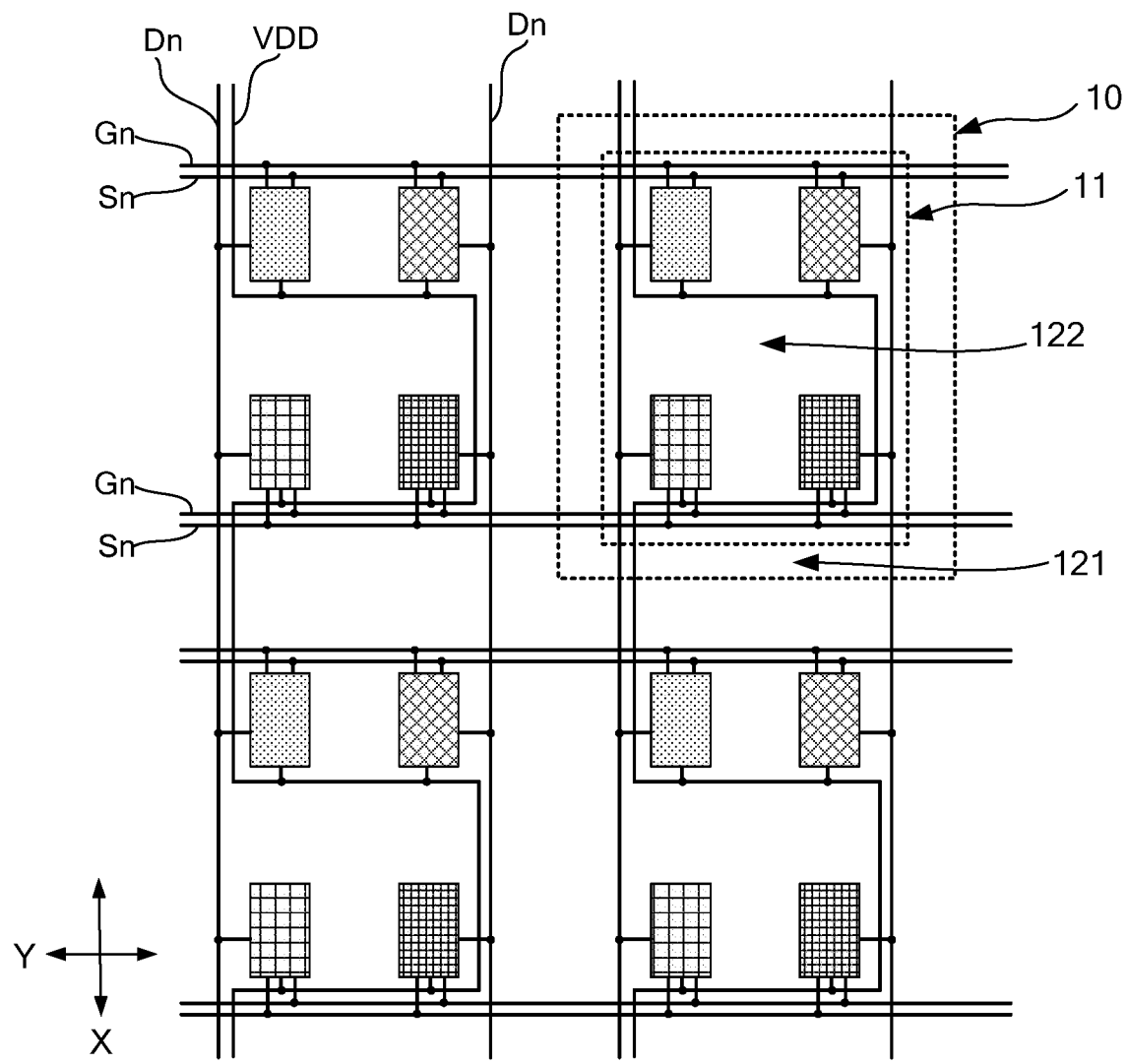
FIG. 6b is a schematic diagram of a structure of a see-through display region of a display substrate of other exemplary embodiments.

In some exemplary embodiments, as shown in FIG. 6b, FIG. 6b is a schematic diagram of a structure of a see-through display region of another display substrate. The see-through display region includes multiple display units 10 arranged in an array on an underlay, wherein a display unit 10 includes a display region 11 and a first see-through region 121, and the first see-through region 121 is disposed on four sides of the display region 11. The display region 11 includes four sub-pixels, and further includes a second see-through region 122 located between adjacent sub-pixels. The second see-through region 122 includes a first region extending along a first direction (which may be a vertical direction X in the figure) and a second region extending along a second direction (which may be a horizontal direction Y in the figure), wherein the first direction intersects the second direction. A see-through region (a first see-through region 121 or a second see-through region 122) is provided on four sides of each sub-pixel, and each sub-pixel is almost entirely surrounded by the first see-through region 121 and the second see-through region 122 except for a small quantity of signal lines between two adjacent display regions 11. In this example, an arrangement mode of signal lines of each display unit 10 may be the same as a wiring mode exemplified in FIG. 6a. In another example, the second see-through region 122 may include the first region extending along the first direction and not include the second region, or the second see-through region 122 may include the second region extending along the second direction and not include the first region. In the display substrate shown in FIG. 6b, along the first direction or the second direction, it may be seen that a see-through region (a region composed of a first see-through region 121 and a second see-through region 122) is divided into multiple small-block regions by first signal lines and second signal lines. In the display substrate of this example, a second see-through region 122 is disposed between sub-pixels within the display region 11, and the first see-through region 121 intersects the second see-through region 122. When light passes through the first see-through region 121 and the second see-through region 122, diffraction fringes generated may spread toward multiple directions, which may reduce a diffraction ghosting phenomenon.

Figure 7A:
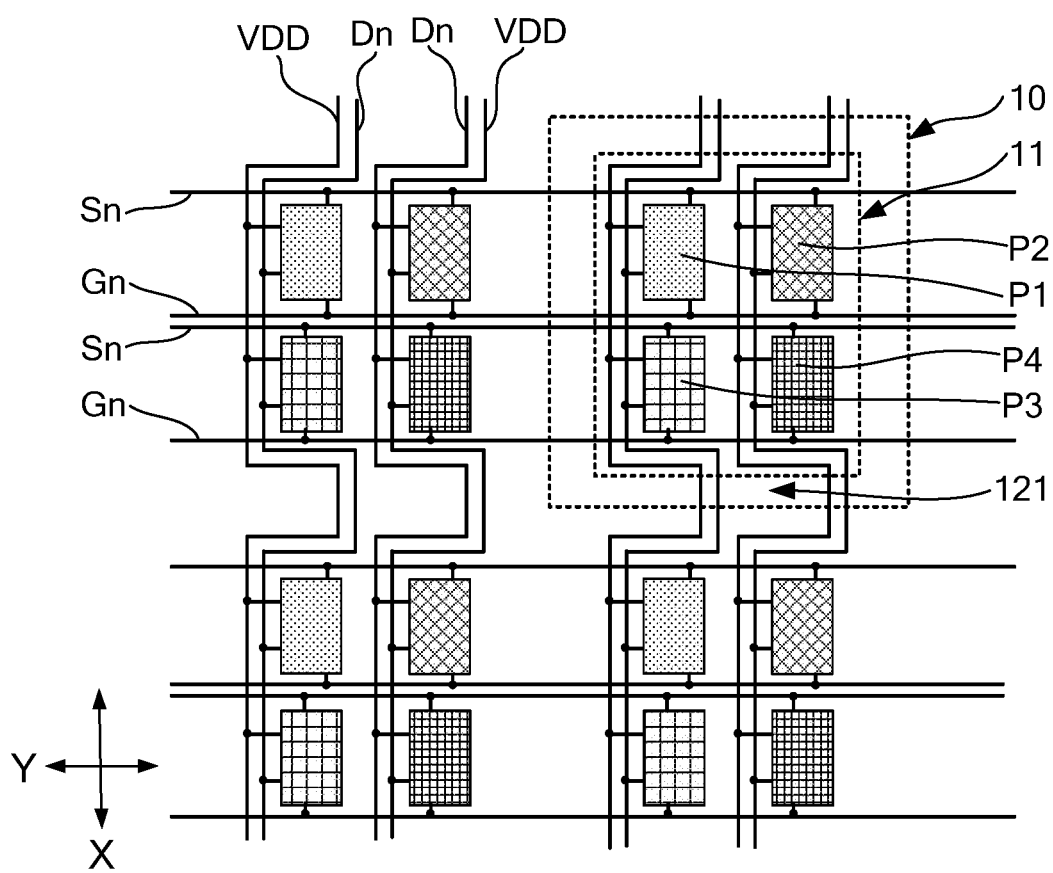
FIG. 7a is a schematic diagram of a structure of a see-through display region of a display substrate of other exemplary embodiments.

In some exemplary embodiments, as shown in FIG. 7a, FIG. 7a is a schematic diagram of a structure of a see-through display region of another display substrate. The see-through display region includes multiple display units 10 arranged in an array on an underlay, wherein each display unit 10 includes a display region 11 and a first see-through region 121. The display region 11 may be rectangular, and the display region 11 includes four sub-pixels arranged in two rows and two columns. The four sub-pixels are a first sub-pixel P1, a second sub-pixel P2, a third sub-pixel P3, and a fourth sub-pixel P4, respectively, wherein the first sub-pixel P1 and the third sub-pixel P3 are located in one sub-pixel column, and the second sub-pixel P2 and the fourth sub-pixel P4 are located in another sub-pixel column. The display region 11 includes a first side and a second side which are opposite, and a third side and a fourth side which are opposite. The first see-through region 121 is disposed on four sides of the display region 11, and a periphery of each display region 11 is almost entirely surrounded by the first see-through region 121 except for a small quantity of signal lines between two adjacent display regions 11. In the display substrate exemplified in FIG. 7a, along the first direction X or the second direction Y, it may be seen that the first see-through region 121 is divided into multiple small-block regions by first signal lines and second signal lines. Compared with a solution that a see-through region is disposed only on one side of a display region in some technologies, for the display substrate of this example, on a premise of keeping both an area of a see-through region and an area of a display region unchanged, a ghosting phenomenon caused by a diffraction effect may be reduced to a certain extent, improving a see-through display effect.

The see-through display region includes multiple first signal lines extending along a first direction (an X direction in the figure) and multiple second signal lines extending along a second direction (a Y direction in the figure), wherein a first signal line includes a data line Dn and a first power supply line VDD, and a second signal line includes a first scan line Gn and a second scan line Sn.

The display unit 10 includes two data lines Dn and two first power supply lines VDD, one data line Dn thereof and one first power supply lines VDD thereof are both located on a first side or a second side (a first side in FIG. 7a) of the display region 11, and the other data line Dn and the other first power supply line VDD are both located between two sub-pixel columns of the display region 11.

In the display unit 10, a data line Dn and a first power supply line VDD both include a first line segment extending along the first direction (shown as extending vertically downward) from a first end (shown as an upper end), a second line segment having one end connected with the first line segment and the other end extending along the second direction (shown as extending horizontally to the left), a third line segment having one end connected with the second line segment and the other end extending along the first direction, a fourth line segment having one end connected with the third line segment and the other end extending along the second direction (shown as extending horizontally to the right), and a fifth line segment having one end connected with the fourth line segment and the other end extending along the first direction; the first line segment and the second line segment are both located on one side of the third side and the fourth side of the display region 11, and the fourth line segment and the fifth line segment are both located on the other side of the third side and the fourth side of the display region 11. In this example, a data line Dn and a first power supply line VDD of each display unit 10 have a same routing direction, both of them are in a shape of the above broken lines and each includes four turning corners. Thus, at turning corners of the data line Dn and the first power supply line VDD, an edge of a first see-through region 121 may have a concave-convex structure to form an irregular pattern, which is beneficial to reduce a diffraction effect, thereby reducing a diffraction ghosting phenomenon, improving a see-through display effect.

In the display unit 10, each data line Dn is connected with a first electrode of a first transistor of a pixel drive circuit of each sub-pixel of a corresponding sub-pixel column. Each first power supply line VDD is connected with a first electrode of a second transistor of a pixel drive circuit of each sub-pixel of a corresponding sub-pixel column. The display unit 10 may further include a second power supply line and a compensation line extending along the first direction, wherein two second power supply lines and two compensation lines may be set, and wiring modes of the second power supply lines and the compensation lines may both be the same as a wiring mode of the first power supply line VDD. The display unit 10 may further include two first scan lines Gn and two second scan lines Sn disposed horizontally, wherein disposing modes of the two first scan lines Gn and the two second scan lines Sn may be the same as a disposing mode in an example of FIG. 5a.

Figure 7B:
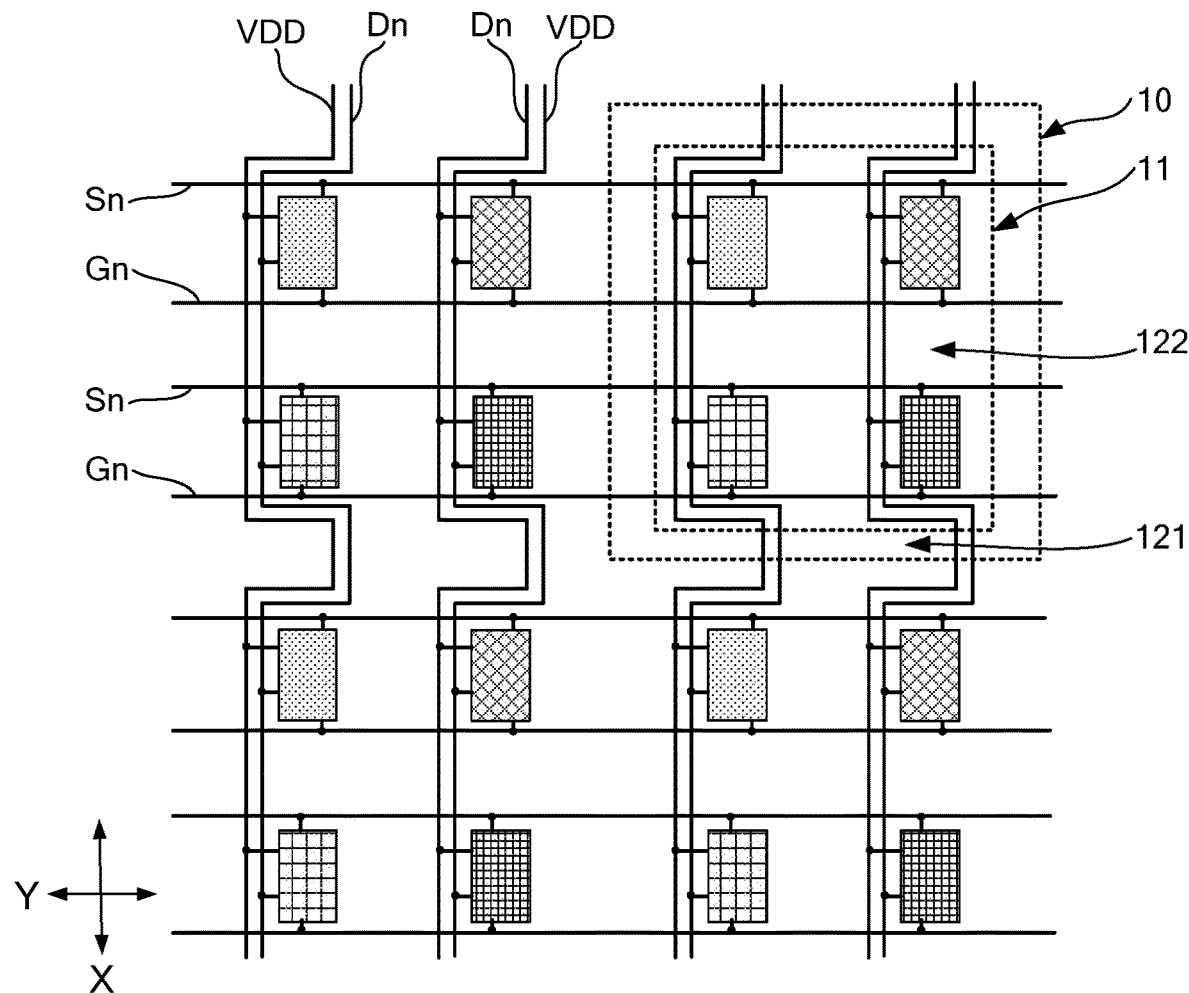
FIG. 7b is a schematic diagram of a structure of a see-through display region of a display substrate of other exemplary embodiments.

In some exemplary embodiments, as shown in FIG. 7b, FIG. 7b is a schematic diagram of a structure of a see-through display region of another display substrate. The see-through display region includes multiple display units 10 arranged in an array on an underlay, wherein a display unit 10 includes a display region 11 and a first see-through region 121, and the first see-through region 121 is disposed on four sides of the display region 11. The display region 11 includes four sub-pixels, and further includes a second see-through region 122 located between adjacent sub-pixels. The second see-through region 122 includes a first region extending along a first direction (which may be a vertical direction X in the figure) and a second region extending along a second direction (which may be a horizontal direction Y in the figure), wherein the first direction intersects the second direction. A see-through region (a first see-through region 121 or a second see-through region 122) is provided on four sides of each sub-pixel, and each sub-pixel is almost entirely surrounded by the first see-through region 121 and the second see-through region 122 except for a small quantity of signal lines between two adjacent display regions 11. In this example, an arrangement mode of first signal lines and second signal lines of each display unit 10 may be the same as a wiring mode exemplified in FIG. 7a. In another example, the second see-through region 122 may include the first region extending along the first direction and not include the second region, or the second see-through region 122 may include the second region extending along the second direction and not include the first region. In the display substrate shown in FIG. 7b, along the first direction or the second direction, it may be seen that a see-through region (a region composed of a first see-through region 121 and a second see-through region 122) is divided into multiple small-block regions by first signal lines and second signal lines. In the display substrate of this example, a second see-through region 122 is disposed between sub-pixels within the display region 11, and the first see-through region 121 intersects the second see-through region 122. When light passes through the first see-through region 121 and the second see-through region 122, diffraction fringes generated may spread toward multiple directions, which may reduce a diffraction ghosting phenomenon.

An embodiment of the present disclosure further provides a display apparatus, including the display substrate described in any of the forgoing embodiments. The display apparatus may be any product or component with a display function, such as a mobile phone, a tablet computer, a television, a display, a laptop computer, a digital photo frame, and a navigator.

In the drawings, a size of a constituent element, and a thickness of a layer, or a region is sometimes exaggerated for clarity. Therefore, one implementation mode of the present disclosure is not necessarily limited to the size, and a shape and a size of each component in the drawings do not reflect actual scales. In addition, the drawings schematically illustrate some examples, and an implementation mode of the present disclosure is not limited to shapes or numerical values shown in the drawings.

In the description herein, "parallel" refers to a state in which an angle formed by two straight lines is above −10° and below 10°, and thus also includes a state in which the angle is above −5° and below 5°. In addition, "vertical" refers to a state in which an angle formed by two straight lines is above 80° and below 100°, and thus also includes a state in which the angle is above 85° and below 95°.

In the description herein, an orientation or position relationship indicated by terms such as "upper", "lower", "left", "right", "top", "inside", "outside", "axial", "four corners", and the like is an orientation or position relationship shown in the drawings, and is intended to facilitate description of the embodiments of the present disclosure and simplification of the description, but not to indicate or imply that a referred structure has a specific orientation and is constructed and operated in the specific orientation, therefore, they should not be understood as limitations on the present disclosure.

In the description herein, unless otherwise specified and defined explicitly, terms "connection", "fixed connection", "installation", and "assembly" should be understood in a broad sense, and, for example, it may be a fixed connection, a detachable connection, or an integrated connection; the terms "installation", "connection", and "fixed connection" may be a direct connection, an indirect connection through an intermediary, or communication inside two elements. For those of ordinary skill in the art, meanings of the above terms in the embodiments of the present disclosure may be understood according to a situation.

The invention claimed is:

1. A display substrate, comprising a see-through display region and a non-display region disposed at a periphery of the see-through display region, wherein the see-through display region comprises an underlay and multiple display units arranged in an array on the underlay, a display unit comprises a display region and a first see-through region, the display region comprises multiple sub-pixels, each sub-pixel comprises a pixel drive circuit and a light emitting element, the pixel drive circuit is configured to drive the light emitting element to emit light; the display region is at least partially surrounded by the first see-through region;

wherein the see-through display region comprises multiple first signal lines extending along a first direction and multiple second signal lines extending along a second direction, wherein the multiple first signal lines and the multiple second signal lines intersect to define multiple display regions and multiple first see-through regions, and a first signal line comprises a data line and a first power supply line;

wherein the display unit comprises two data lines and one first power supply line, wherein the two data lines are respectively located on a first side and a second side of the display region, and the first power supply line is located between the two data lines;

in the display unit, the first power supply line comprises a first line segment extending along the first direction from a first end, a second line segment having one end connected with the first line segment and the other end extending along the second direction, a third line segment having one end connected with the second line segment and the other end extending along the first direction, a fourth line segment having one end connected with the third line segment and the other end extending along the second direction, and a fifth line segment having one end connected with the fourth line segment and the other end extending along the first direction; the first line segment and the fifth line segment are both close to one of the two data lines, and the third line segment is close to the other of the two data lines.

2. The display substrate according to claim 1, wherein the display region comprises a first side and a second side which are opposite, and a third side and a fourth side which are opposite, and the first see-through region is disposed on four sides of the display region.

3. The display substrate according to claim 1, wherein the first see-through region is disposed between display regions of two adjacent display units.

4. The display substrate according to claim 1, wherein the display region further comprises a second see-through region, wherein the second see-through region is disposed between at least two adjacent sub-pixels.

5. The display substrate according to claim 4, wherein the second see-through region comprises a first region extending along a first direction, wherein the first region is located between two adjacent sub-pixel columns or two adjacent sub-pixel rows.

6. The display substrate according to claim 5, wherein the second see-through region further comprises a second region extending along a second direction, wherein the first direction intersects the second direction; each sub-pixel is at least partially surrounded by the first see-through region and the second see-through region.

7. The display substrate according to claim 1, wherein the display region comprises four sub-pixels arranged in two rows and two columns, and a shape of the display region is a rectangle.

8. A display apparatus, comprising the display substrate according to claim 1.

9. A display substrate, comprising a see-through display region and a non-display region disposed at a periphery of the see-through display region, wherein the see-through display region comprises an underlay and multiple display units arranged in an array on the underlay, a display unit comprises a display region and a first see-through region, the display region comprises multiple sub-pixels, each sub-pixel comprises a pixel drive circuit and a light emitting element, the pixel drive circuit is configured to drive the light emitting element to emit light; the display region is at least partially surrounded by the first see-through region; wherein the see-through display region comprises multiple first signal lines extending along a first direction and multiple second signal lines extending along a second direction, wherein a first signal line comprises a data line and a first power supply line;

the display unit comprises two data lines and two first power supply lines, one data line thereof and one first power supply lines thereof are both located on a first side or a second side of the display region, and the other data line and the other first power supply line are both located between two sub-pixel columns of the display region;

in the display unit, both a data line and a first power supply line comprise a first line segment extending along the first direction from a first end, a second line segment having one end connected with the first line segment and the other end extending along the second direction, a third line segment having one end connected with the second line segment and the other end extending along the first direction, a fourth line segment having one end connected with the third line segment and the other end extending along the second direction, and a fifth line segment having one end connected with the fourth line segment and the other end extending along the first direction; both the first line segment and the second line segment are located on one side of a third side and a fourth side of the display region, and the fourth line segment and the fifth line segment are both located on the other side of the third side and the fourth side of the display region.

10. The display substrate according to claim 9, wherein the display region comprises a first side and a second side which are opposite, and a third side and a fourth side which are opposite, and the first see-through region is disposed on four sides of the display region.

11. The display substrate according to claim 9, wherein the first see-through region is disposed between display regions of two adjacent display units.

12. The display substrate according to claim 9, wherein the display region further comprises a second see-through region, wherein the second see-through region is disposed between at least two adjacent sub-pixels.

13. The display substrate according to claim 12, wherein the second see-through region comprises a first region extending along a first direction, wherein the first region is located between two adjacent sub-pixel columns or two adjacent sub-pixel rows.

14. The display substrate according to claim 13, wherein the second see-through region further comprises a second region extending along a second direction, wherein the first direction intersects the second direction; each sub-pixel is at least partially surrounded by the first see-through region and the second see-through region.

15. The display substrate according to claim 9, wherein the display region comprises four sub-pixels arranged in two rows and two columns, and a shape of the display region is a rectangle.

16. A display apparatus, comprising the display substrate according to claim 9.

* * * * *